(12) United States Patent
Deshayes

(10) Patent No.: US 9,980,406 B2
(45) Date of Patent: May 22, 2018

(54) ELECTRICAL EQUIPMENT COMPRISING ELECTRONIC CARDS

(71) Applicant: Zodiac Aero Electric, Montreuil (FR)

(72) Inventor: Olivier Deshayes, Toulouse (FR)

(73) Assignee: Zodiac Aero Electric, Montreuil (FR)

( * ) Notice: Subject to any disclaimer, the term of this patent is extended or adjusted under 35 U.S.C. 154(b) by 0 days. days.

(21) Appl. No.: 14/392,321

(22) PCT Filed: Jun. 26, 2014

(86) PCT No.: PCT/EP2014/063466
§ 371 (c)(1),
(2) Date: Jul. 6, 2016

(87) PCT Pub. No.: WO2014/207081
PCT Pub. Date: Dec. 31, 2014

(65) Prior Publication Data
US 2017/0027076 A1    Jan. 26, 2017

(30) Foreign Application Priority Data
Jun. 26, 2013 (FR) ..................................... 13 56118

(51) Int. Cl.
*H05K 7/14* (2006.01)
*H05K 7/16* (2006.01)
*H05K 7/20* (2006.01)

(52) U.S. Cl.
CPC ......... *H05K 7/1418* (2013.01); *H05K 7/1412* (2013.01); *H05K 7/16* (2013.01); *H05K 7/20127* (2013.01)

(58) Field of Classification Search
CPC .... H05K 7/142; H05K 7/1424; H05K 7/1474; H05K 7/1489
See application file for complete search history.

(56) References Cited

U.S. PATENT DOCUMENTS 5,172,305 A * 12/1992 DeWilde .............. H05K 7/1425
                                                 361/725
5,337,220 A *  8/1994 Granitz .................. G06F 1/184
                                                  174/359

(Continued)

OTHER PUBLICATIONS

International Search Report dated Jul. 16, 2014, issued in corresponding International Application No. PCT/EP2014/063466, filed Jun. 26, 2014, 2 pages.

*Primary Examiner* — Robert J Hoffberg
*Assistant Examiner* — Hung Dang
(74) *Attorney, Agent, or Firm* — Christensen O'Connor Johnson Kindness PLLC

(57) ABSTRACT

Electrical equipment, in particular for aircraft, comprising: a fixed frame delimiting a storage compartment having a front opening, a pivoting frame mounted to pivot on the fixed frame to occupy a storage position in which it is placed inside the storage compartment of the fixed frame and an accessibility position in which it extends through the front opening of the fixed frame, the pivoting frame delimiting a reception space having at least one access opening, situated behind its front, for the introduction of electronic cards and their removal when the pivoting frame is in said accessibility position in which said access opening is situated in front of said front opening of the fixed frame, the pivoting frame being provided with electrical connection means that can be coupled to electrical connection means of the electronic cards.

9 Claims, 5 Drawing Sheets

(56) References Cited

U.S. PATENT DOCUMENTS

| | | | | |
|---|---|---|---|---|
| 5,918,089 A * | 6/1999 | Malinich | ................ | G03G 15/80 |
| | | | | 361/809 |
| 6,097,591 A * | 8/2000 | Ircha | ....................... | G06F 1/181 |
| | | | | 312/223.2 |
| 6,491,360 B2 * | 12/2002 | Qiu | ......................... | H05K 7/16 |
| | | | | 312/223.2 |
| 7,542,288 B2 * | 6/2009 | Lanus | ................ | H05K 7/20563 |
| | | | | 361/610 |
| 7,643,280 B2 * | 1/2010 | Chen | ................... | G11B 33/123 |
| | | | | 361/679.33 |
| 8,054,620 B2 * | 11/2011 | Roesner | ............... | G11B 33/128 |
| | | | | 312/223.2 |
| 2002/0079790 A1 | 6/2002 | Qiu | | |
| 2004/0184243 A1 * | 9/2004 | Mease | .................... | G06F 1/184 |
| | | | | 361/725 |
| 2010/0091443 A1 * | 4/2010 | Lam | ..................... | G06F 1/1616 |
| | | | | 361/679.33 |
| 2016/0073524 A1 * | 3/2016 | Tsai | .................... | G11B 33/124 |
| | | | | 361/808 |

* cited by examiner

ELECTRICAL EQUIPMENT COMPRISING ELECTRONIC CARDS

FIELD OF THE INVENTION

The present invention relates to the field of electrical equipment comprising electronic cards.

DESCRIPTION OF THE RELEVANT ART

It is known and commonplace practice to mount, parallel to one another, electronic cards in fixed frames provided with electrical connection means for these cards with electrical cables or harnesses of electrical wires, the cards being individually removable and replaceable by sliding them.

Unfortunately, the bulk of the fixed frames and the fitting and removal of the electronic cards pose difficulties linked to the restricted spaces available, as much in first constructions as in replacements or refurbishments.

Such is the particular case when such electrical equipment has to be or is installed behind internal walls of aircraft, boats, submarines or land vehicles, in which these internal walls have front access doors or hatches for the fitting and removal of the electronic cards.

SUMMARY OF THE INVENTION

The object of the present invention is another solution for the installation of electronic cards.

An electrical equipment item is proposed, in particular for aircraft, which comprises a fixed frame having a front and delimiting at least one storage compartment having a front opening which is formed through this front, and a pivoting frame having a front, mounted to pivot on the fixed frame to occupy a storage position in which it is placed inside the storage compartment (3) of the fixed frame and an accessibility position in which it extends through the front opening of the fixed frame.

The pivoting frame delimits at least one reception space having at least one access opening, situated behind its front, for the introduction of electronic cards into this reception space and their removal when the pivoting frame is in said accessibility position in which said access opening is situated in front of said front opening of the fixed frame.

Furthermore, the pivoting frame is provided with electrical connection means that can be coupled to electrical connection means of the electronic cards introduced into said reception space.

The storage position and the accessibility can be determined by abutment means.

The electrical connection means can be situated opposite said access opening.

The front of the pivoting frame may comprise a front wall closing said front opening of the fixed frame when the pivoting frame is in its storage position.

The fixed frame can be provided with at least one additional electronic card having electrical connection means that can be coupled to electrical connection means of the electronic cards introduced into said reception space.

The additional electronic card can be arranged opposite said access openings in relation to said reception recesses.

The fixed frame can be provided with at least one external electrical connection means, linked to said additional electronic card by at least one flexible electrical cable.

Said electronic cards can be arranged in said reception space parallel to one another and at right angles to the pivoting axis of the pivoting frame.

Said pivoting frame can comprise, in said reception space, opposing grooves into which the opposite edges of said electronic cards can slide.

At least some of the faces of the fixed frame and of the pivoting frame can have ventilation passages.

BRIEF DESCRIPTION OF THE DRAWINGS

An electrical equipment item will now be described as a non-limiting example and illustrated by the drawing in which.

Figure 1:
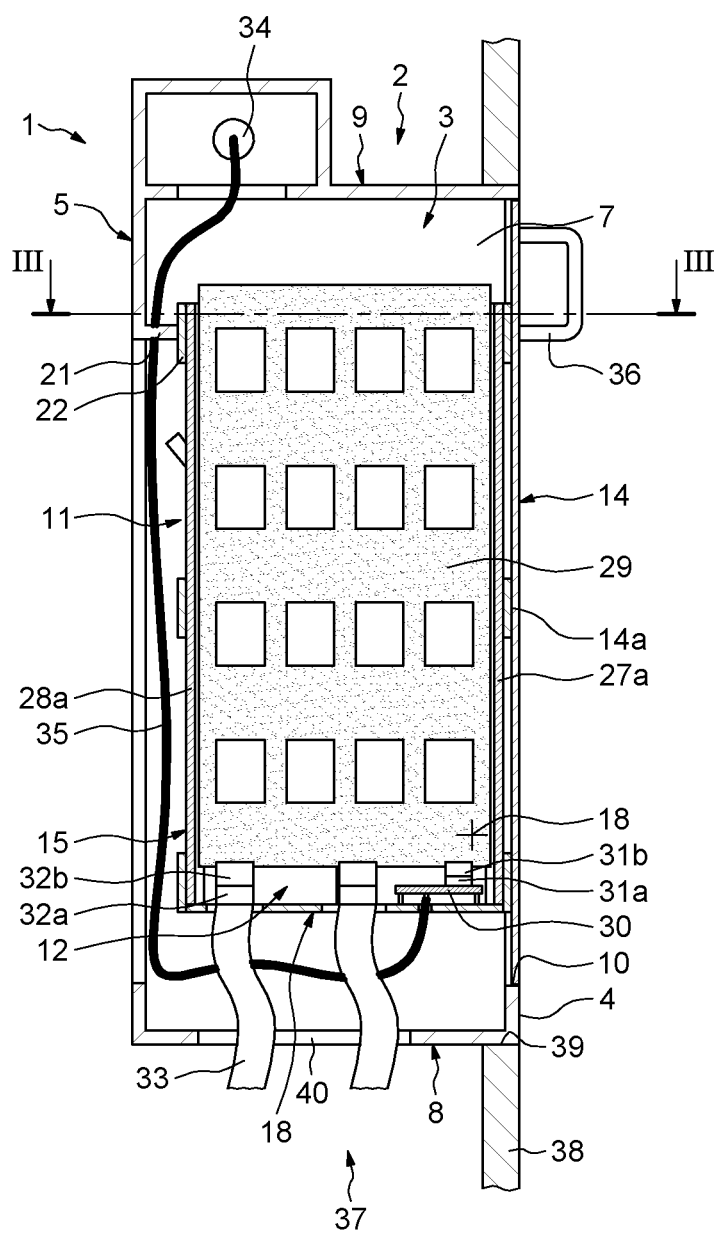
FIG. 1 represents a vertical cross section of an electrical equipment item, along the line I-I of FIG. 3, in a storage position.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or methods, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

An electrical equipment item 1 comprises a fixed frame 2 delimiting a storage compartment 3, for example of generally parallelepipedal form.

The fixed frame 2 comprises a front 4, a rear face 5, and, joining the latter, opposing lateral faces 6 and 7, a bottom face 8 and a top face 9.

A rectangular front opening 10 for access to the storage compartment 3 is formed through the front 4.

The electrical equipment item 1 also comprises a pivoting frame 11, for example of generally parallelepipedal form which is mounted to pivot on the fixed frame 2 to occupy a vertical storage position (FIG. 1) in which it is placed inside the storage compartment 3 of the fixed frame 2 and an inclined accessibility position (FIG. 2) in which it extends through the front access opening 10 of the fixed frame 2 such that its top part is situated outside the storage compartment 3 and in front of the front 4.

The pivoting frame 11 delimits a reception space 12 having a top access opening 13 and comprises a front 14 which has a front wall 14a, a rear face 15, and, joining the latter, opposing lateral faces 16 and 17 and a bottom face 18 forming a bottom opposite to the top access opening 13.

Figure 5:
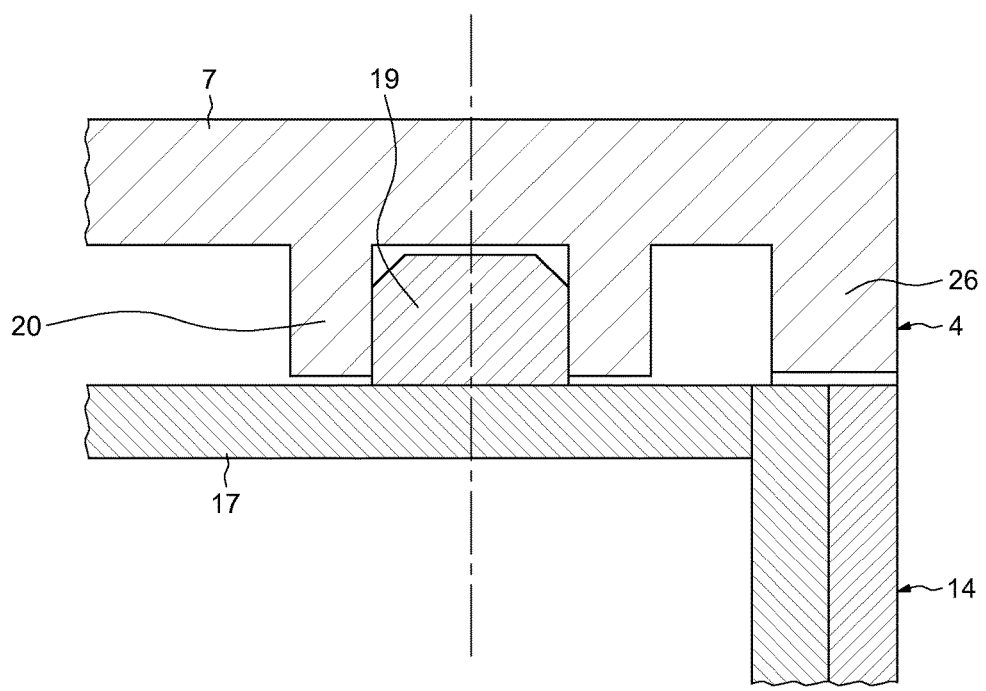
FIG. 5 represents a partial cross section of the articulation of the electrical equipment item of FIG. 1.

According to one variant embodiment, the horizontal pivoting axis 18 of the pivoting frame 11 relative to the fixed frame 2, which extends parallel to the front 4 and at a small distance from the latter, is placed in the bottom front part of the pivoting frame 11 and is determined by protruding opposing pivots 19 borne by the opposing lateral faces 16 and 17 of the pivoting frame 11, which are engaged in bushes 20 borne by the opposing lateral faces 6 and 7 of the fixed frame 2 (FIG. 5).

The fixed frame 9 and the pivoting frame 11 have rear abutments 21 and 22, formed on the rear faces 5 and 15 and bearing on one another when the pivoting frame 11 is in its storage position, in which the front wall 14a of the front 14 is engaged in the front opening 10 of the front 4, with a small peripheral gap.

The lateral faces 16 and 17 of the pivoting frame 11 are provided with abutments 23 and 24 which, when the pivoting frame 11 is in its accessibility position in which the top access opening 13 is situated completely forward of the front 4 of the fixed frame 2, come to bear on the vertical rims 25 and 26 adjacent to the access opening 10. According to a variant embodiment, the pivoting frame 11 could be linked to the fixed frame 2 by retaining flexible cables in its accessibility position.

Inside the reception space 12, the front 14 and the rear face 15 of the pivoting frame 11 respectively have a plurality of opposing and parallel grooves 27 and 28 which extend at right angles to the bottom 18 and which are open upwards. The front 14 and the rear face 15 of the pivoting frame 11 can be provided with plates 27a and 28a in which these grooves 27 and 28 are formed.

Figure 2:
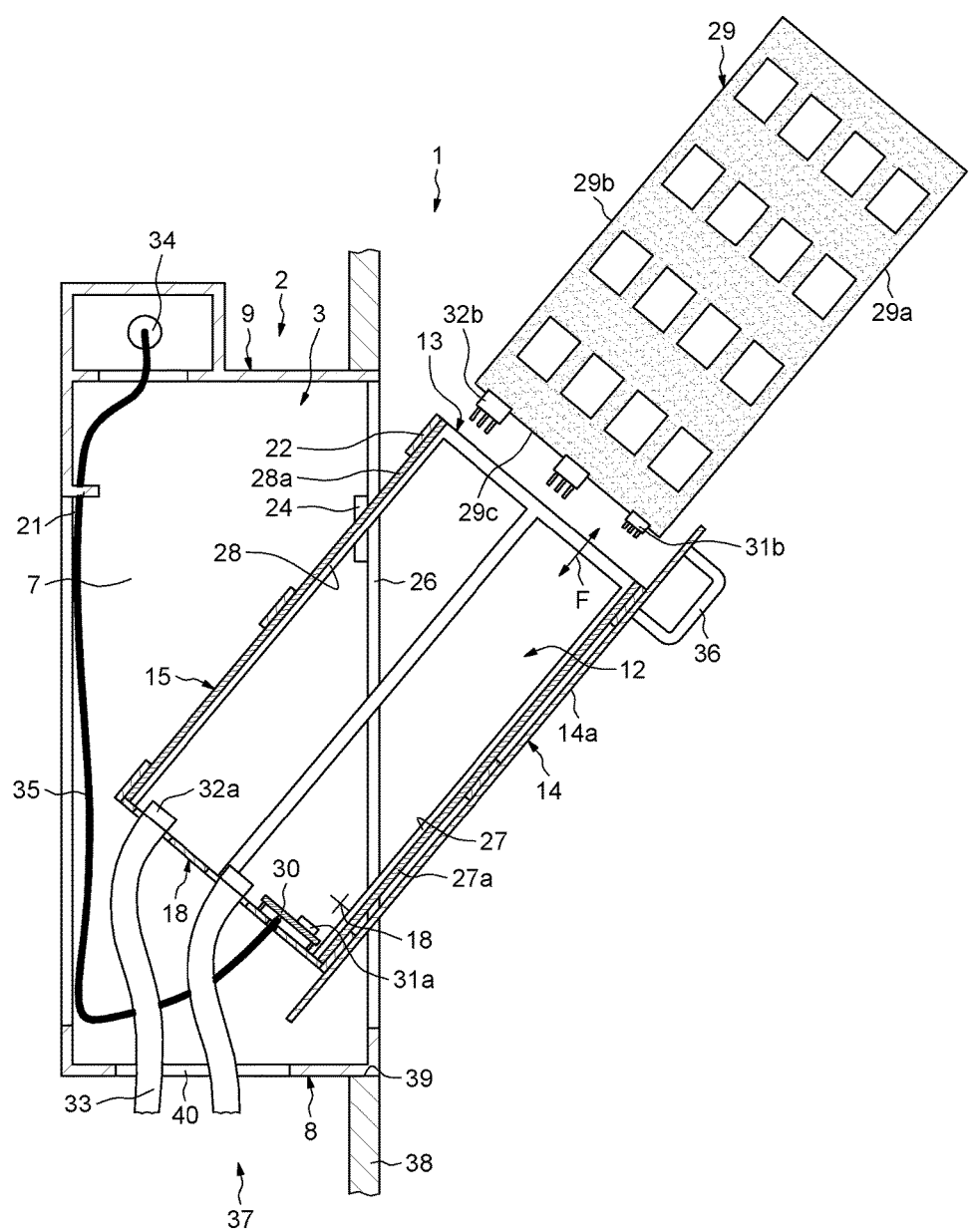
FIG. 2 represents the electrical equipment item of FIG. 1 in an accessibility position.
Figure 3:
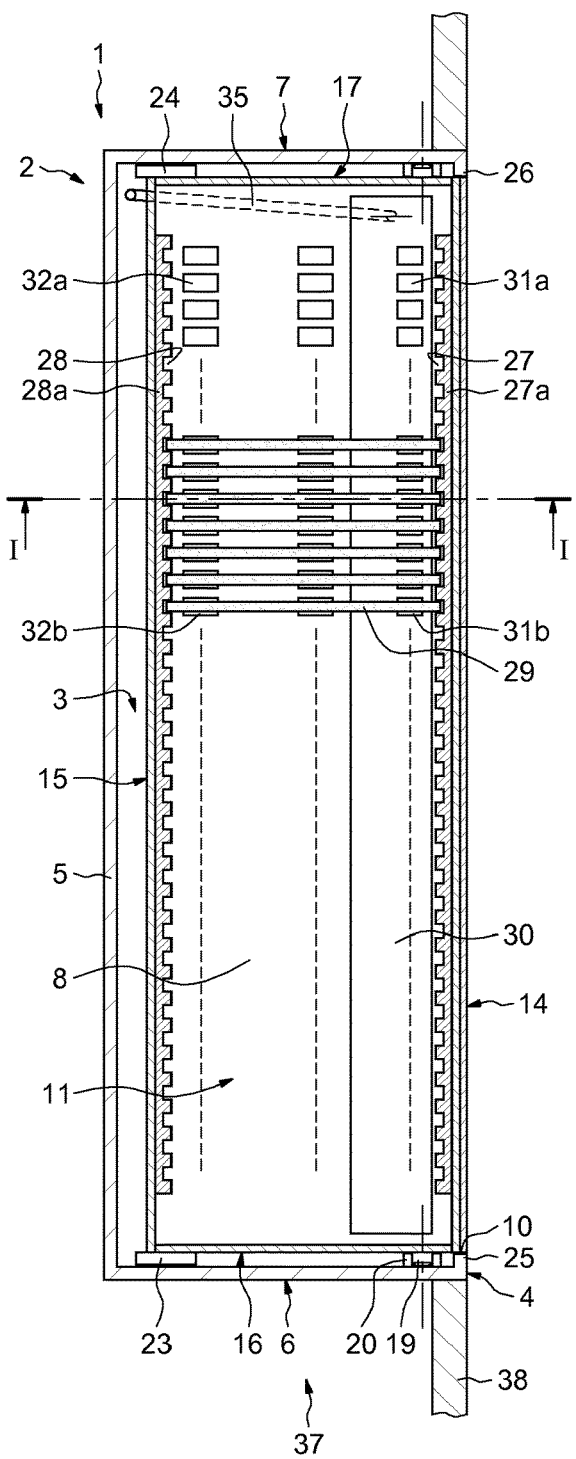
FIG. 3 represents a horizontal cross section of the electrical equipment item of FIG. 1, along the line III-III.
Figure 4:
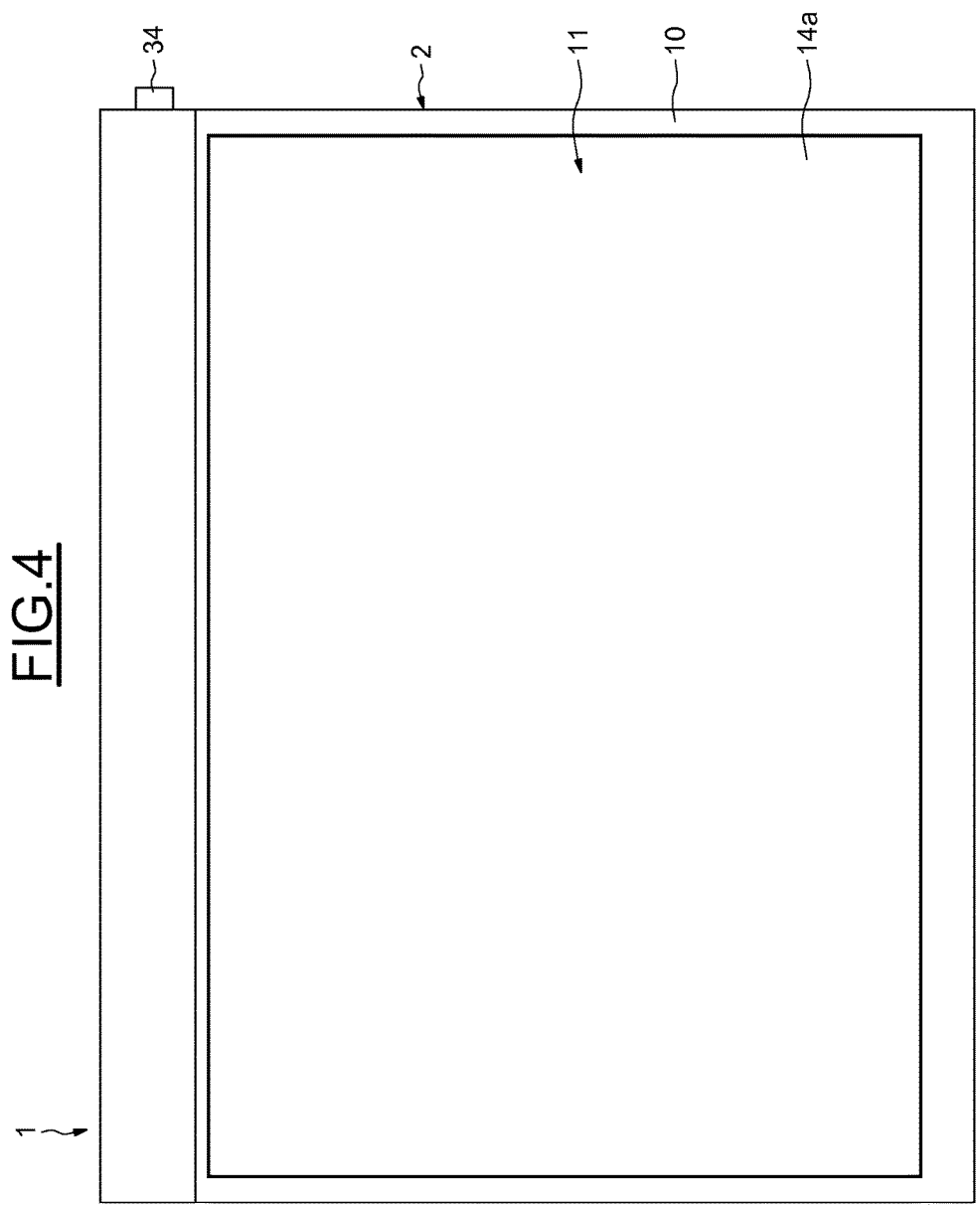
FIG. 4 represents a front view of the electrical equipment item of FIG. 1.

The pairs of opposing grooves 27 and 28 are adapted to receive by sliding the parallel opposite edges 29a and 29b of a plurality of electronic cards 29, which can be introduced into the reception space 12 through the top access opening 13 and towards the bottom 18 and, for example, in planes at right angles to the pivoting axis 18, and be extracted therefrom when the pivoting frame 11 is in its accessibility position, according to the arrow F of FIG. 2. The pairs of opposing grooves 27 and 28 are arranged in such a way that the electronic cards 29 are placed parallel to one another, at right angles to the front 14 and vertically. So, when they are introduced in or extracted from their respective places, the electronic cards are moved along directions which are parallel to the front 14 of the pivoting frame 11 and perpendicular to the horizontal pivoting axis 18 of the pivoting frame 11 relative to the fixed frame 2.

In the bottom part of the reception space 12 of the pivoting frame 11, there is an additional electronic card 30, for example a motherboard, which is borne by the bottom 18 of the pivoting frame 11, parallel to and at a short distance from the bottom 18, and which covers only part of the bottom 18 extending along the front 14.

On its face turned towards the access opening 13, the additional electronic card 30 is provided with a plurality of fixed electrical connectors 31a.

The bottom 18 of the pivoting frame 11 bears a plurality of fixed electrical connectors 32a The electronic cards 29 bear, on their edge 29c introduced first into the reception space 12 of the pivoting frame 11, electrical connectors 31b and 32b which plug into the electrical connectors 31a and 32a when the electronic cards 29 are introduced into the reception space 12. Thus, each pair of grooves 27 and 28 has at least one corresponding fixed electrical connector 31a and at least one fixed electrical connector 32a that can be electrically coupled to the electrical connectors 31b and 32b of a specific electronic card 29 introduced into the reception space 12 of the pivoting frame 11 by sliding in this pair of grooves.

The electrical connectors 32a are linked to the ends of harnesses of electrical wires 33, for example through a passage 40 formed in the bottom face 8 of the fixed frame 2. The end parts of the harnesses 33 are sufficiently flexible not to oppose the pivoting of the pivoting frame 11 between its storage position and its accessibility position.

The other ends of the electrical harnesses 33 can be linked to electrical members to be controlled or monitored.

The fixed frame 2 is provided, for example on its lateral face 7, with an external electrical connector 34 which is linked to the additional electronic card 30 via a flexible electrical cable 35 which extends inside the fixed frame 2 and outside the pivoting frame 11 and which, for example, passes through the bottom 18 of the pivoting frame 11 to reach the additional electronic card 30.

The length and the arrangement of the flexible electrical cable 35 are adapted so as not to hamper the pivoting of the pivoting frame 11 in relation to the fixed frame 2.

The external electrical connector 34 can have plugged into it an end electrical connector of an external electrical cable whose other end is, for example, linked up to a computer for programming and monitoring the additional electronic card 30 and the electronic cards 29.

Generally, the fixed frame 2 equipped with the pivoting frame 11 provided with the additional electronic card 30 and the electrical cable 35 linking the additional electronic card 30 and the external electrical connector 34 are installed in a desired place.

Then, the electrical wire harnesses 33 are linked selectively to the electrical connectors 32a of the pivoting frame 11.

Then, the pivoting frame 11 is pivoted or tilted forwards to its inclined position of accessibility of its top access opening 13 and electronic cards 29 are introduced into the reception space 12 of the pivoting frame 11 by sliding in the corresponding grooves 27 and 28 until their electrical connectors 31b and 32b are correctly plugged into the electrical connectors 31a and 32a.

Then, the pivoting frame 11 is pivoted or tilted backwards to its vertical storage position in the fixed frame 2.

The fixed frame 2 and the pivoting frame 11 can be provided with known locking means (not represented), such as a lock or a bolt, to secure the pivoting frame 11 in its storage position.

If, subsequently, some of the electronic cards 29 have to be removed, replaced or added to, all that is needed is to pivot the pivoting frame 11 as described previously.

To pivot the pivoting frame 11, its front 14 can, for example, be equipped with an operating handle 36.

The different faces of the fixed frame 2 and of the pivoting frame 11, which can be formed by profile sections and/or plates, may have ventilation passages for air to circulate, by natural convection, in order to cool the electronic cards 29 and 30 and avoid condensation and to evacuate the condensation by surface runoff.

The electrical equipment item 1 can be placed in a space 37 placed behind a vertical partition 38 having a front opening 39, for example in such a way that the front of the fixed enclosure 2 is situated in this opening 39.

The electrical equipment item 1 which has just been described is particularly suitable for installation in particular in an aircraft so as to constitute a unit for distributing primary or secondary electrical energy originating from internal sources, for example from generators or batteries, to payloads or to other electrical units of the aircraft.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An electrical equipment, in particular for aircraft, comprising:
    a fixed frame having a front and delimiting at least one storage compartment having a front opening which is formed through the front, and
    a pivoting frame having a front, mounted to pivot on the fixed frame to occupy a storage position in which the pivoting frame is placed inside the at least one storage compartment of the fixed frame and an accessibility position in which the pivoting frame extends through the front opening of the at least one storage compartment,
    the pivoting frame delimiting at least one reception space having at least one access opening, situated behind the front of the pivoting frame, for the introduction of electronic cards into the at least one reception space and their removal when the pivoting frame is in the accessibility position in which the at least one access opening is situated in front of the front opening of the at least one storage compartment,
    the pivoting frame being provided with electrical connectors coupleable to electrical connectors of the electronic cards introduced into the at least one reception space,
    wherein the pivoting frame is provided with at least one additional electronic card having an electrical connector that is coupleable to an electrical connector of the electronic cards introduced into the at least one reception space.

2. The electrical equipment of claim 1, wherein the storage position and the accessibility position are determined by a plurality of abutments.

3. The electrical equipment of claim 1, wherein the electrical connectors of the pivoting frame are situated opposite the at least one access opening.

4. The electrical equipment of claim 1, wherein the front of the pivoting frame comprises a front wall closing the front opening of the at least one storage compartment when the pivoting frame is in the storage position.

5. The electrical equipment of claim 1, wherein the at least one additional electronic card is arranged opposite the at least one access opening in relation to the at least one reception space.

6. The electrical equipment of claim 1, wherein the fixed frame is provided with at least one external electrical connector, linked to the at least one additional electronic card by at least one flexible electrical cable.

7. The electrical equipment of claim 1, wherein the electronic cards are arranged in the at least one reception space parallel to one another and at right angles to a pivoting axis of the pivoting frame.

8. The electrical equipment of claim 1, wherein the pivoting frame comprises, in the at least one reception space, opposing grooves into which opposite edges of the electronic cards are configured to slide.

9. The electrical equipment of claim 1, wherein at least one of the front of the fixed frame and the front of the pivoting frame have ventilation passages.

\* \* \* \* \*